(12) United States Patent
Wieloch et al.

(10) Patent No.: US 6,456,495 B1
(45) Date of Patent: Sep. 24, 2002

(54) LOGIC CONTROLLER HAVING DIN RAIL BACKPLANE AND LOCKING MEANS FOR INTERCONNECTED DEVICE MODULE

(75) Inventors: Christopher John Wieloch; Anthony Edward Develice, both of Brookfield; Michael Thomas Little, Milwaukee, all of WI (US)

(73) Assignee: Eaton Corporation, Cleveland, OH (US)

( * ) Notice: Subject to any disclaimer, the term of this patent is extended or adjusted under 35 U.S.C. 154(b) by 0 days.

(21) Appl. No.: 09/523,607

(22) Filed: Mar. 13, 2000

(51) Int. Cl.[7] .................................................. H05K 7/14
(52) U.S. Cl. ...................... 361/729; 361/683; 361/732; 361/801; 361/802; 361/788; 312/215; 312/222; 312/228.1; 312/223.2
(58) Field of Search ................................ 361/729, 686, 361/732, 728, 724, 725, 801, 802, 759, 788; 312/215, 216, 222, 228.1, 223.2

(56) References Cited

U.S. PATENT DOCUMENTS

| | | | | |
|---|---|---|---|---|
| 4,738,632 A | * | 4/1988 | Schmidt et al. ............. | 439/341 |
| 5,031,075 A | * | 7/1991 | Casanova et al. ............ | 361/802 |
| 5,043,847 A | * | 8/1991 | Deinhardt et al. .......... | 361/736 |
| 5,222,897 A | * | 6/1993 | Collins et al. ............... | 439/157 |
| 5,227,957 A | * | 7/1993 | Deters ........................ | 361/686 |
| 5,432,682 A | * | 7/1995 | Giehl et al. .................. | 361/796 |
| 5,455,744 A | | 10/1995 | Watanabe .................... | 361/801 |
| 5,822,184 A | * | 10/1998 | Rabinovitz .................. | 361/685 |
| 6,052,278 A | * | 4/2000 | Tanzer et al. ................ | 361/685 |
| 6,252,765 B1 | * | 6/2001 | Balzaretti et al. ............ | 361/683 |

FOREIGN PATENT DOCUMENTS

DE 3331035 A1 4/1984 ........... G05B/11/01

* cited by examiner

*Primary Examiner*—Leo P. Picard
*Assistant Examiner*—David Foster
(74) *Attorney, Agent, or Firm*—Martin J. Moran

(57) ABSTRACT

A logic controller formed by self-contained device modules plugged onto a DIN rail and onto a backplane contained in the DIN rail, the modules variously comprising a power supply, a logic control, I/O devices and gateways, each I/O device having microprocessor power, and the modules having a sliding lock movable into position adjacent DIN-rail-engaging flexible tabs to block deflection of the tabs and removal of the module from the DIN rail.

11 Claims, 5 Drawing Sheets

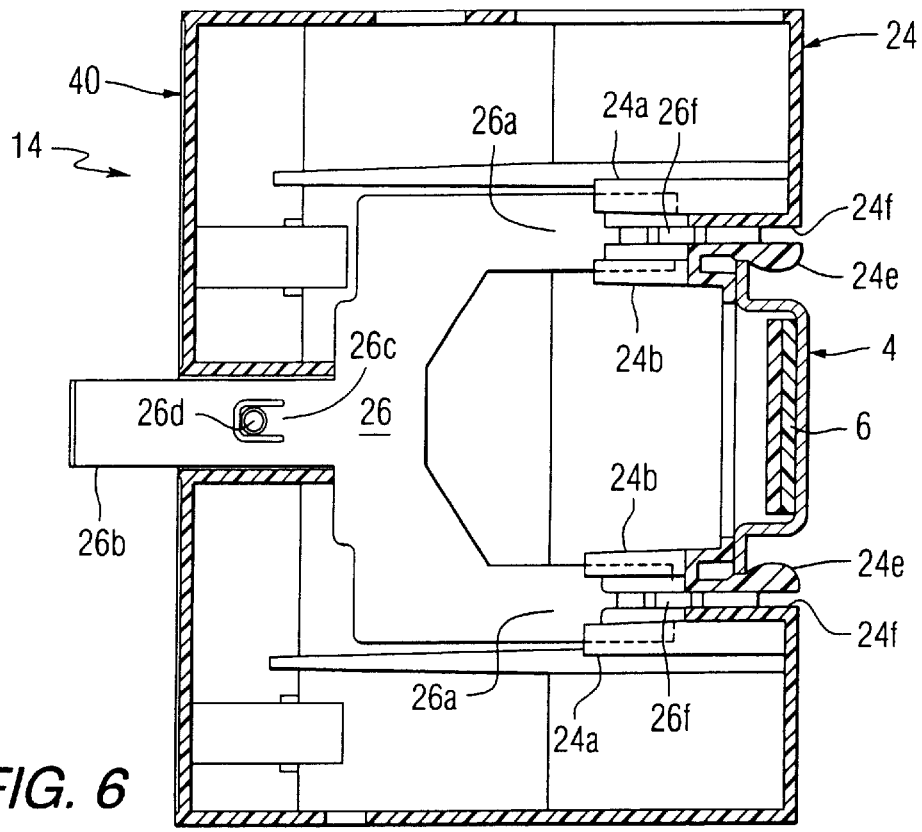
FIG. 6
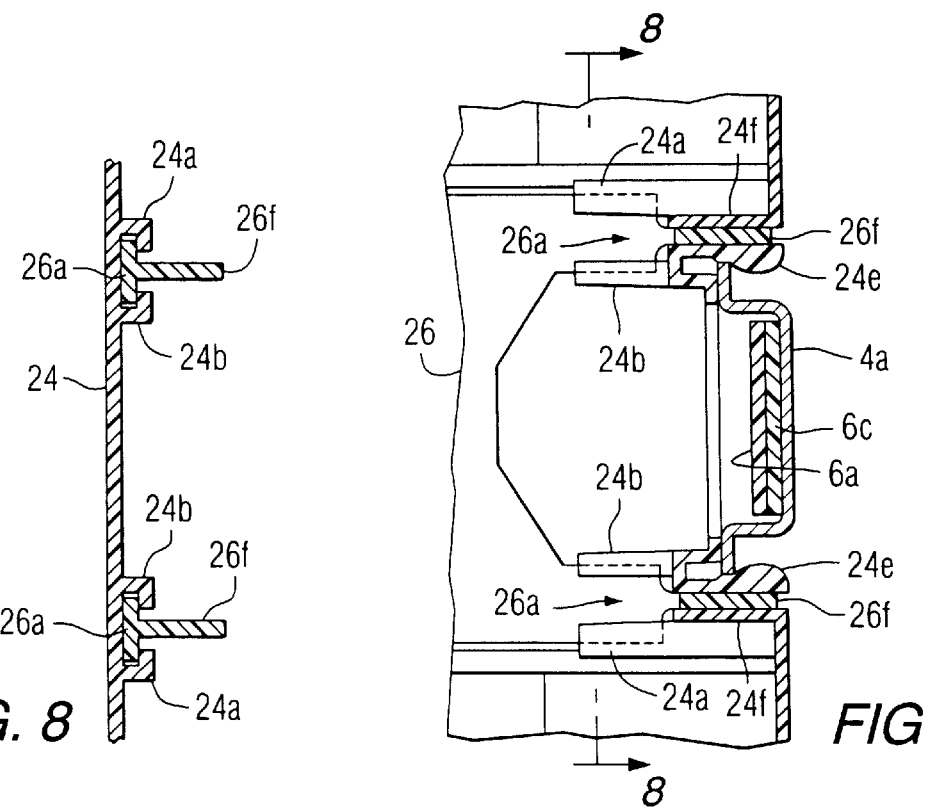
FIG. 8
FIG. 7

LOGIC CONTROLLER HAVING DIN RAIL BACKPLANE AND LOCKING MEANS FOR INTERCONNECTED DEVICE MODULE

CROSS-REFERENCE TO RELATED APPLICATIONS

Not Applicable

STATEMENT REGARDING FEDERALLY SPONSORED RESEARCH OR DEVELOPMENT

Not Applicable

MICROFICHE APPENDIX

Not Applicable

BACKGROUND OF THE INVENTION

The present invention relates to logic controllers. Particularly this invention relates to plug-in device modules such as I/O modules which attach to a logic controller backplane. Such controllers commonly have the backplane mounted within an open molded housing to which the plug-in modules are attached at predetermined locations to complete the housing and plug in to the backplane. In such apparatus, neither the housing containing the backplane nor the plug-in device module represent complete stand-alone enclosed assemblies. Known controllers are restricted in an ability to expand or be connected to remote modules or controllers.

BRIEF SUMMARY OF THE INVENTION

This invention provides a logic controller wherein device modules for the logic controller are individual, self-contained device modules which may be mounted directly to a DIN rail. Moreover, this invention provides a logic controller having device modules of the aforementioned type and wherein the backplane for the logic controller is mounted directly to the DIN rail. The device modules are attached to the DIN rail in a straight-on motion which facilitates a plug-in connection with a connector of the backplane and are secured to the DIN rail and to the backplane by a single lock lever accessible from the front of the device module. Still further this invention provides a device module which is capable of active attachment to a backplane and which may be connected in parallel with the backplane to a remote module by means of a jumper to the remote device. This device module is further capable of daisy chain connection from one module to another if a backplane connection is not available or desired. The invention, its features and advantages, will become more readily apparent in the following description when read in conjunction with the accompanying drawings.

BRIEF DESCRIPTION OF THE DRAWINGS

FIG. 6 is a cross-sectional view of the device module of this invention taken along the line 6—6 in FIG. 3;

FIG. 7 is a fragmentary cross-sectional view similar to FIG. 6, but showing a lock lever in an operated position;

FIG. 8 is a fragmentary cross section view taken along the line 8—8 in FIG. 7.

DETAILED DESCRIPTION OF THE PREFERRED EMBODIMENT

Figure 1:
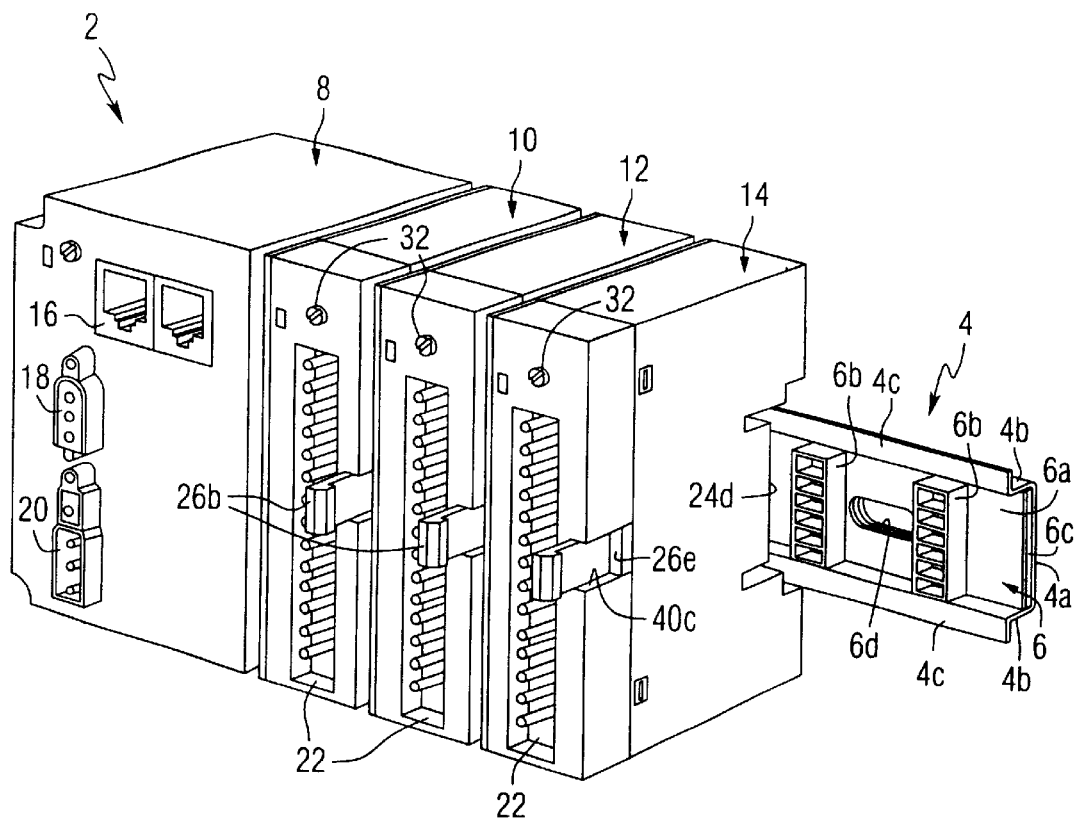
FIG. 1 is a three-dimensional showing of a logic controller comprising a DIN rail having a backplane assembly and a plurality of device modules attached to the DIN rail and backplane.
Figure 2:
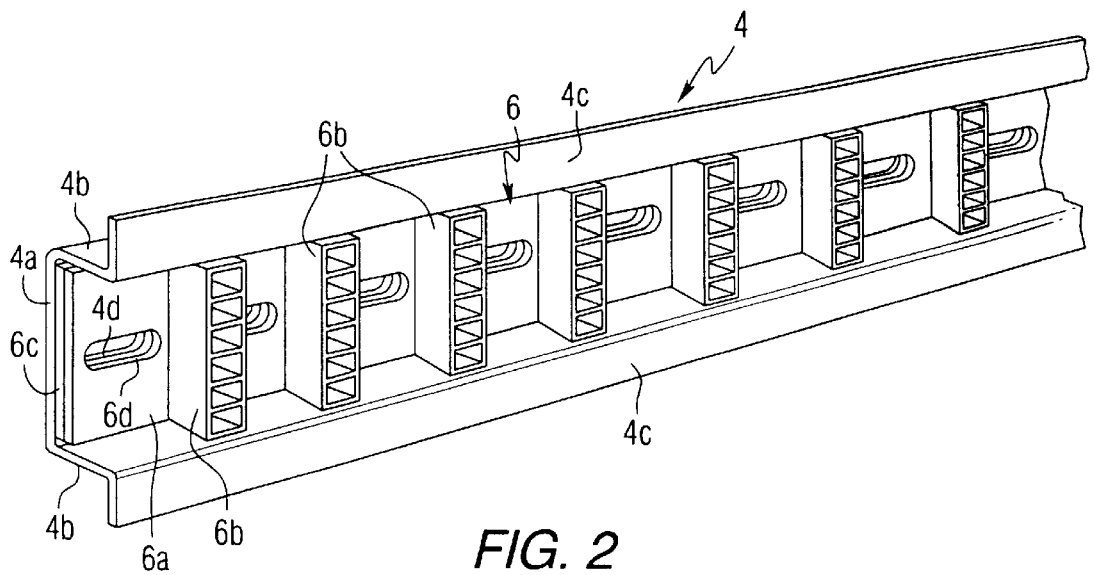
FIG. 2 is a three-dimensional view of the DIN rail and backplane assembly of this invention.

A logic controller 2 constructed according to the invention is shown in FIG. 1. A DIN rail 4, shown separately in FIG. 2, comprises an elongated channel having a flat base 4a, forwardly directed lateral side walls 4b and outwardly directed mounting flanges 4c along the forward edges of side walls 4b. A plurality of longitudinally spaced openings 4d are provided in the base 4a along the length thereof for mounting the DIN rail to a panel or the like.

A backplane assembly 6 is secured to the base 4a of DIN rail 4. Backplane assembly 6 comprises an elongated multilayer laminated printed wire board (PWB) 6a having traces printed on several of the layers according to a well known process. The trace pattern of the several layers is not specifically shown, but it is such as to provide power and communication bus along the length of the assembly. The PWB 6a is provided with through hole patterns at spaced intervals along the length to which pin connectors 6b are attached. The pins extend through the holes in the PWB 6a and connect to the particular traces. The pins are held within the insulating housing of the connector 6b such that the housing is trapped against the front surface of PWB 6a. An insulator strip 6c is affixed to the back side of PWB 6a by an adhesive or the like. PWB 6a and strip 6c have longitudinally spaced openings 6d which generally correspond with the openings 4d in the DIN rail base. Backplane assembly 6 is preferably affixed to the base 4a of DIN rail 4 by an adhesive, although mechanical attachments such as by rivets is also contemplated.

A plurality of device modules 8, 10, 12 and 14 are attached to the DIN rail 4 and backplane assembly 6 as can be seen in FIG. 1. Device module 8 is a power supply module and typically is a double width module. Power supply module 8 has a double element phone jack communication connector 16, a three-pin communication connector 18 and a power connector 20, all accessible at a front face thereof. Device modules 10, 12 and 14 are I/O modules, each essentially identical externally. Each I/O module 10, 12 and 14 has a multi-pin connector 22 in the front face for receiving a hard-wired connection plug (not shown). Other modules may be attached to the DIN rail and backplane assembly such as a logic controller, network gateways, or the like.

Figure 3:
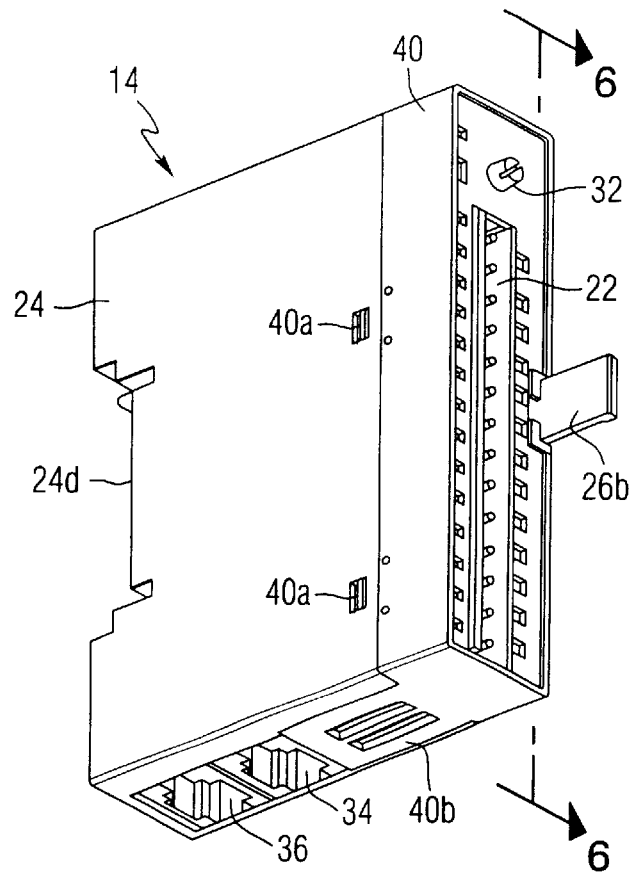
FIG. 3 is an isometric view of an individual device module from FIG. 1, viewed from the lower front of that device.
Figure 4:
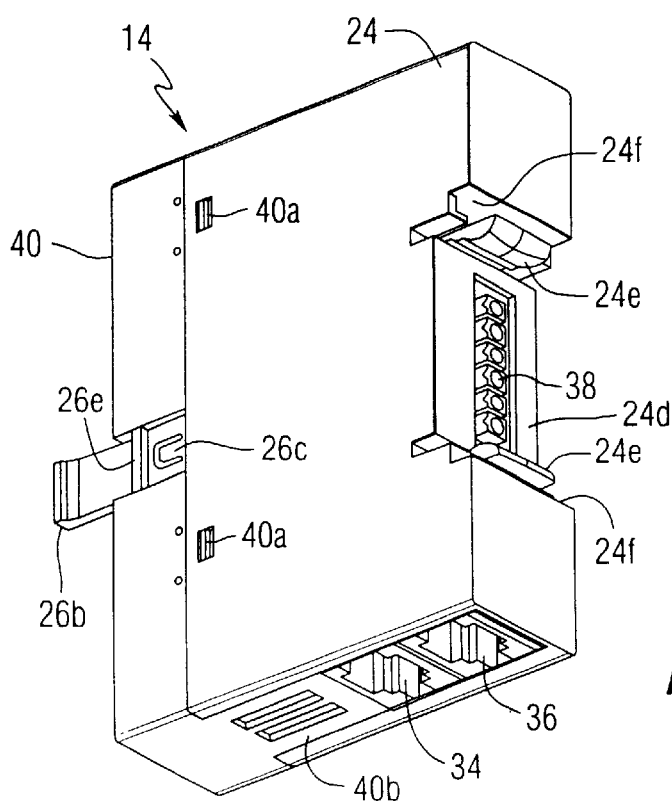
FIG. 4 is an isometric view of the device module of FIG. 3 viewed from the lower back of the device.
Figure 5:
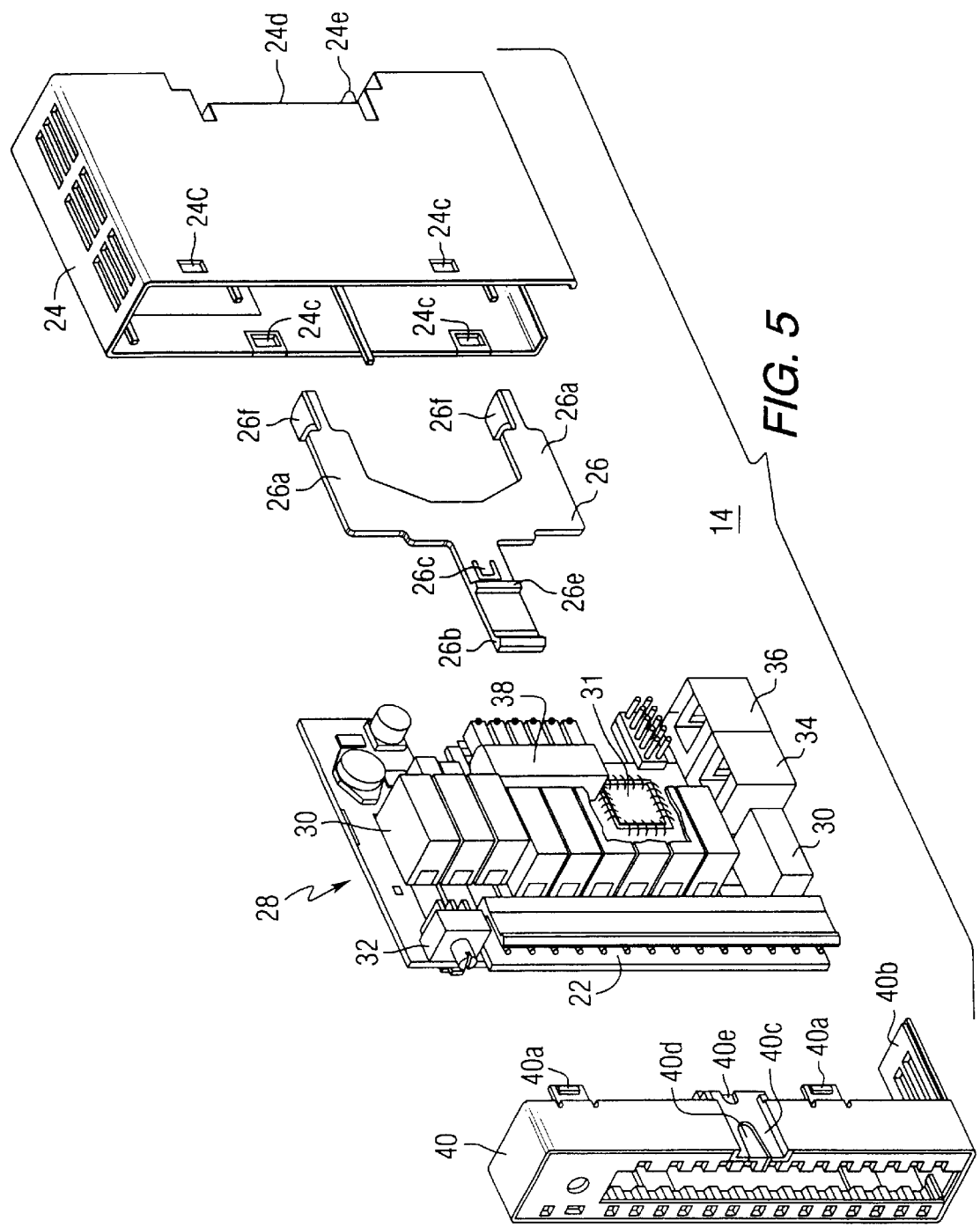
FIG. 5 is an exploded isometric view of the device module of FIGS. 3 and 4.

The I/O device module 14 is shown individually in FIGS. 3, 4 and 5 as being typical of the modules 10, 12 and 14. It comprises a hollow insulating housing 24 which is open to the front. A Y-shaped lock lever 26 is disposed in housing 24 against a near side wall as oriented in FIG. 5. The distal ends 26a of the upper legs of the Y-shaped lock lever are slidably received within slots formed by molded projections 24a and 24b on the side walls (FIGS. 6, 7 and 8). The base 26b of the Y-shaped lock lever forms the handle for the lock lever as will become apparent hereinafter. A logic board assembly 28 is also disposed within the insulating housing 24. The particular module 14 illustrated is an output module and thus the logic board 28 is a relay board containing ten relays 30 and other components of the output device such as a microprocessor controller chip 31, and the like. The multiple pin connector 22 is affixed along the left-hand forward edge of the logic board as viewed in FIG. 5. An address setting rotary dip switch 32 is mounted immediately above the connector 22. A pair of phone jack plugs 34 and 36 are positioned along a lower edge of the board and a six-pin connector 38 is positioned at the back edge of the board.

Although not shown, the interior of housing 24 and of a cover member 40 are suitably configured to engage and hold the logic board assembly 28 securely in place when the enclosure assembly is completed. Cover member 40 has a plurality of snap tabs 40a which engage rectangular openings 24c in housing 24 to attach the cover 40 to the housing 24. The lower wall of cover 40 as oriented in FIG. 5 has an extension 40b that fills a space in housing 24 adjacent phone jack connectors 34 and 36 to complete the lower wall of the module. One side wall of cover 40 has a central recess 40c into which handle 26b of lock lever 26 is disposed for sliding movement. The inner face of recess 40c has a pair of sub-recesses 40d and 40e. Lock lever 26 has a resilient tab 26c formed by a U-shaped slot in the base of that lever. A domed-shaped projection 26d is formed on one side of the tab 26c to engage in either sub-recess 40d or 40e as determined by the position of the lock lever 26, i.e., whether the lock lever is extended in its inoperative position or depressed to its operative position as will be apparent hereinafter. Immediately forward of tab 26c is a transverse bar 26e integrally formed on the lock lever which abuts the forward edge of housing 24 in the depressed, operative position of the lock lever to positively locate the operating position of the lever. Cover number 40 further has appropriate openings in the front face thereof for indicator LED's (not specifically shown), the adjusting knob of rotary dip switch 32, and the multiple pin connector 22.

Referring particularly to FIGS. 4 and 6, the back wall of housing 24 is centrally recessed at 24d. A pair of flexible tabs 24e are integrally molded on the housing, and extend rearward along opposite ends of the recessed area 24d. The facing surfaces of tabs 24e have curved convex bosses thereon which provide an interference with outer edges of flanges 4c of DIN rail 4 when the device module 14 is attached to the DIN rail. Straight-on pressure to the module 14 causes the tabs 24e to deflect outwardly away from each other and snap over the edges of the DIN rail flanges 4c. When the surface of recess 24d seats flush against the forward surface of DIN rail flanges 4c, the flexible tabs 4e spring back inwardly to grip the edges and hold the module tightly against the flanges.

The aforedescribed attachment of module 14 to DIN rail 4 also effects plug-in connection between connector 38 (accessible through an opening in recessed area 24d of housing 24) and a connector 6b of the backplane assembly.

Housing 24 has wall portions 24f spaced from and parallel with tabs 24e. Openings are provided in housing 24 adjacent the roots of tabs 24e, through which openings offset ends 26f of the distal ends 26a of lock lever 26 project. Movement of lock lever 26 to its depressed position wherein bar 26e abuts the forward edge of housing 24, moves offset ends 26f into the space between wall portions 24f and flexible tabs 24e, thereby blocking outward movement of the tabs away from each other and securely holding the module 14 to DIN rail 4 and backplane assembly 6. Therefore, attachment of plugs to the pin connectors 22 at the front of the device modules can be made without concern that the module itself will come loose from its backplane connection.

Figure 9:
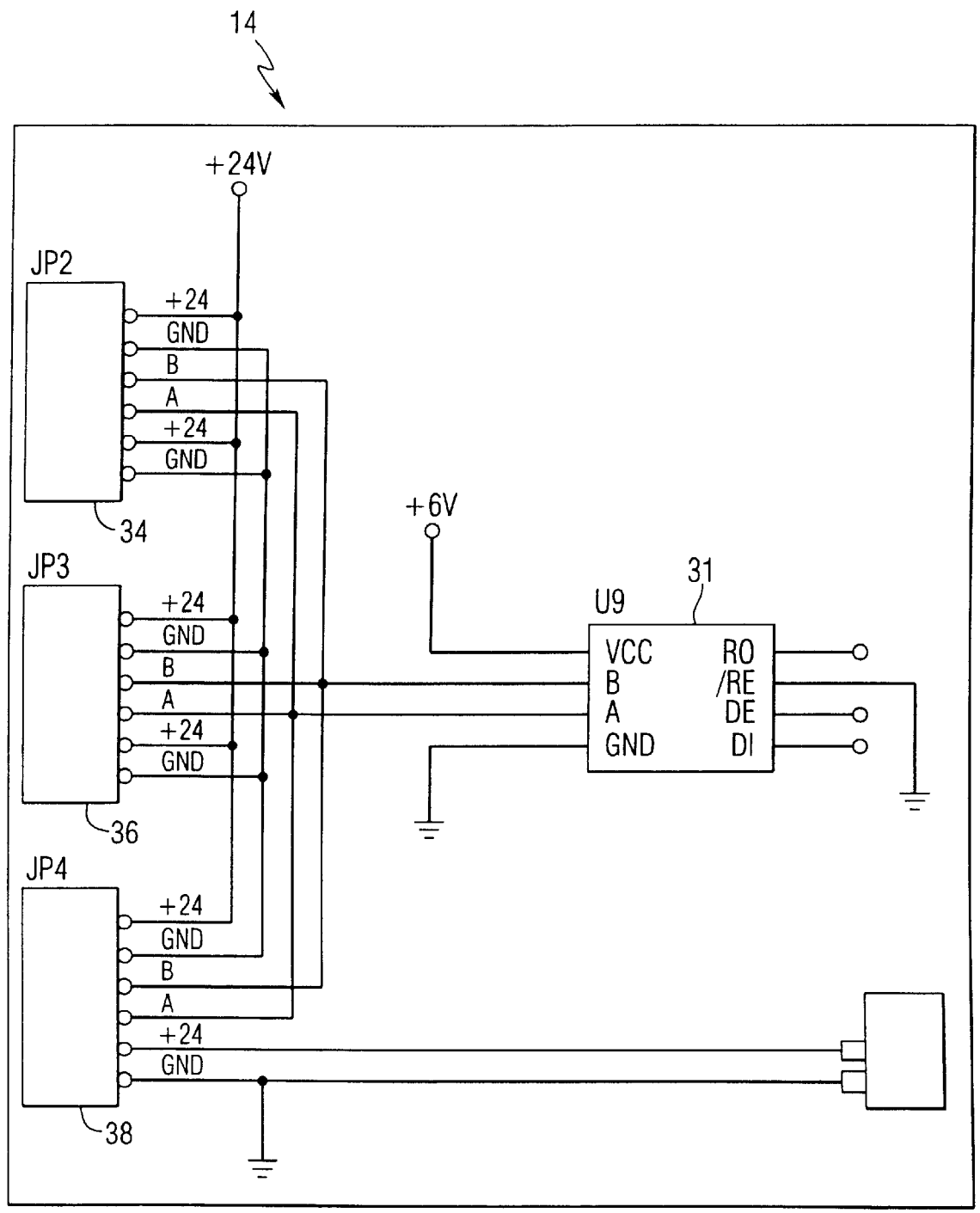
FIG. 9 is a schematic view of the device module of this invention showing electrical interconnection of connectors for the module.

Phone jack connectors 34 and 36 are connected in parallel with connector 38 as may be seen in FIG. 9, thereby enabling parallel connection of the logic controller on DIN rail 4 to another remote module or controller by means of a jumper from the appropriate phone jack connectors 34 and 36 to the similar connectors on the remote device. Alternatively, the device modules may be attached to a customary DIN rail not having the backplane assembly 6 and be daisy chain connected by jumpers via the phone jacks 34 and 36 in a known manner.

The foregoing has described a particular improved logic controller which eliminates a need for a separate housing member for a backplane assembly. Although the logic controller, DIN rail and backplane assembly and the device modules have been shown in a single preferred embodiment representing the best mode contemplated of carrying out the invention, it is to be understood that the invention is susceptible to various modifications and changes without departing from the scope of the appended claims.

What is claimed is:

1. Logic control apparatus comprising:
   a DIN rail mounting channel having an elongated base, fowardly directed walls along opposite longitudinal edges of said base, and co-planar flanges extending outwardly along respective distal edges of said walls;
   an elongated backplane assembly carried by said DIN rail adjacent said base, said backplane assembly comprising a printed wire board having conductive traces thereon, and plug-in connectors attached thereto at longitudinally spaced intervals, said plug-in connectors being electrically connected to said conductive traces and projecting forwardly between said walls; and
   device modules attached to said DIN rail flanges, said device modules each comprising means securing said device module to said flanges, and a logic board comprising a backplane connector coupled to a respective said plug-in connector, remote device connector means, logic control means for processing electrical signals between said remote device connector means and said backplane connector, and a switch selectively settable for assigning a network address for said module.

2. The logic control apparatus defined in claim 1 wherein each device module comprises a pair of phone jack connectors connected in parallel with said backplane connector for alternate daisy chain connection of said modules and for jumpered connection to a remote device module.

3. The logic control apparatus defined in claim 2 wherein said logic control means comprises a microprocessor.

4. The logic control apparatus defined in claim 1 wherein said device module comprises a housing and cover assembled to provide a unitary enclosure for said device module, said housing and cover having respective openings for access to said backplane connector, remote device connector means and said switch.

5. The logic control apparatus defined in claim 4 wherein said securing means comprises flexible tabs projecting from said housing, said tabs having inwardly convex bosses on respective facing surfaces engageable with outer edges of said DIN rail flanges, said tabs being deflected outwardly by said flanges when said module is pressed onto or pulled from said DIN rail.

6. The logic control apparatus defined in claim 5 wherein said securing means comprises a lock lever slidably mounted in said housing, said lock lever having a handle extending outside said housing at a forward portion of said housing, said lock lever further having portions aligned in openings in said housing adjacent said tabs, depression of said lock lever handle portion into said housing effecting movement of said portions alongside said tabs, blocking outward deflection of said tabs.

7. The logic control apparatus defined in claim 6 wherein said housing comprises rigid wall segments parallel to respective said tabs to define spaces between said segments and said tabs, said lock lever portions moving into said spaces upon depression of said lock lever handle portion filling said spaces.

8. Logic control apparatus comprising:

a Din rail mounting channel;

a backplane assembly affixed to said DIN rail, said backplane assembly having a plurality of plug-in connectors;

a power supply module attached to said DIN rail and connected to at least one of said plug-in connectors;

device modules attached to said DIN rail, each device module connected to a respective plug-in connector and having a selector switch manually operable for setting a network address for a respective said device module.

9. The logic control apparatus defined in claim 8 wherein said device modules each comprise microprocessor logic controller means.

10. The logic control apparatus defined in claim 9 wherein said device modules each comprise connector jacks for daisy chain and remote device connection, said connector jacks being connected electrically in parallel with said device module connection to said respective plug-in connector of said backplane.

11. The logic control apparatus defined in claim 8 wherein each said device module comprises an enclosure having resilient tabs for gripping said DIN rail, said tabs being deflectable away from each other in attachment and detachment from said DIN rail, and said device module further comprises a slidable lock lever having blocking portions selectively movable into positions adjacent outer surfaces of said resilient tabs blocking deflection of said tabs.

* * * * *